United States Patent [19]

Kanamori

[11] Patent Number: 4,857,477
[45] Date of Patent: Aug. 15, 1989

[54] PROCESS FOR FABRICATING A SEMICONDUCTOR DEVICE

[75] Inventor: Jun Kanamori, Tokyo, Japan

[73] Assignee: Oki Electric Industry Co., Ltd., Tokyo, Japan

[21] Appl. No.: 95,147

[22] Filed: Sep. 11, 1987

[30] Foreign Application Priority Data

Sep. 18, 1986 [JP] Japan .................. 61-217973

[51] Int. Cl.$^4$ .......................... H01L 27/10
[52] U.S. Cl. ...................... 437/47; 437/60; 437/52; 437/203; 437/228; 437/919; 357/236; 357/67
[58] Field of Search .............. 156/643, 644; 437/43, 437/51, 52, 60, 67, 203, 228; 357/23.6; 148/DIG. 50

[56] References Cited

U.S. PATENT DOCUMENTS

| | | | |
|---|---|---|---|
| 4,353,086 | 10/1982 | Jaccodine | 437/203 |
| 4,523,369 | 6/1985 | Nagakubo | 437/67 |
| 4,534,824 | 8/1985 | Chen | 437/67 |
| 4,577,395 | 3/1986 | Shibata | 437/67 |
| 4,636,281 | 1/1987 | Buiguez et al. | 437/67 |
| 4,693,781 | 9/1987 | Leung et al. | 156/643 |
| 4,707,218 | 11/1987 | Giammarco et al. | 157/666.1 |

FOREIGN PATENT DOCUMENTS 0202560 11/1983 Japan .
2159326 10/1985 United Kingdom .

OTHER PUBLICATIONS

Bassousi "Low Temperature Methods for Rounding Silicon Nozzles," IBMTDB vol. 20, No. 2, Jul. 77, 810–11.

Primary Examiner—Brian E. Hearn
Assistant Examiner—Tom Thomas
Attorney, Agent, or Firm—Spencer & Frank

[57] ABSTRACT

In a process for fabricating a semiconductor device having a trench at the surface of a semiconductor substrate, a first mask layer is formed to have an opening whose side is set back from an area where the trench will be formed, a second mask layer is formed on the side of the opening of the first mask layer with an opening corresponding to the area where the trench will be formed, and an etching is performed using the first and the second mask layer as a mask to form the trench.

9 Claims, 3 Drawing Sheets

PROCESS FOR FABRICATING A SEMICONDUCTOR DEVICE

BACKGROUND OF THE INVENTION

The present invention relates to a process for fabricating a semiconductor device in which a trench is formed at the surface of a silicon substrate, a capacitor is formed at the trench, and element isolation is also achieved at the trench.

An example of a prior art process of this nature is disclosed in Japanese Patent Application Publication No. 12739/1983. This prior art is described with reference to FIGS. 1A to 1D.

First, as shown in FIG. 1A, an oxide mask 2 for forming a trench is formed on a semiconductor substrate 1.

Next, a reactive ion etching (RIE) is performed using the oxide mask 2 as a mask to form a trench 3, as shown in FIG. 1B.

Then, the oxide mask 2 is removed, and an insulator film 4 is formed as shown in FIG. 1C.

Polysilicon 5 is thereafter formed in the trench 3 covered with the insulator film 4. The polysilicon 5 acts as a capacitor electrode.

The above process has a drawback in that the trench formed by the reactive ion etching has sharp edges. This tendency is more acute in the formation of the minute patterns required today. The sharp edges can cause a concentrated electric field and stress in the insulator film formed thereon. As a result, leakage currents may occur. This can deteriorate the device characteristic or make the device inoperative. As a solution to this problem, attempts have been made to slightly etch the substrate surface after removal of the oxide film, or to form a thin oxide film and then remove it. But they have not been successful.

SUMMARY OF THE INVENTION

An object of the invention is to provide a process for fabricating a semiconductor device in which sharpness of the edge of the trench can be reduced and controlled well, and an insulator film thereon has the desired characteristics.

According to the invention, there is provided a process for fabricating a semiconductor device having a trench, in which, in addition to a trench-forming mask having an opening generally corresponding to the trench but having a slightly larger dimension, sidewalls are formed on the sidewalls of the opening of the mask. A trench is formed using the mask with the sidewall as a mask. Then, the sidewall is removed and a process for rounding the edge is performed. The mask is thereafter removed. An insulator film is formed over the trench. The radius of the rounded profile can be controlled by the thickness of the sidewall. The radius of the rounded profile can therefore be freely chosen without affecting the active area.

DETAILED DESCRIPTION OF THE PREFERRED EMBODIMENTS

An embodiment of the invention will now be described with reference to FIGS. 2A to 2I.

Figure 1A:
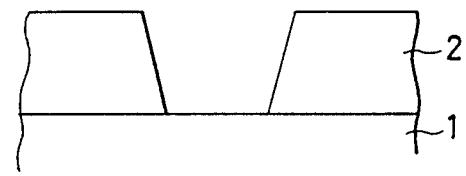
FIGS. 1A to 1D are schematic cross-sectional views showing various steps of prior art fabrication of a semiconductor device.
Figure 1B:
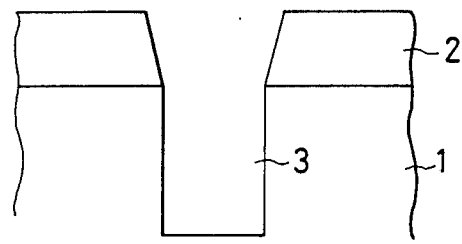
Figure 1C:
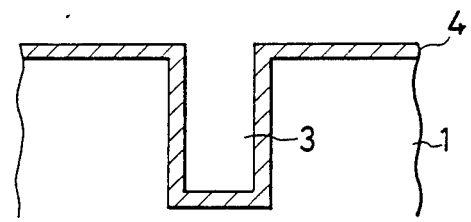
Figure 1D:
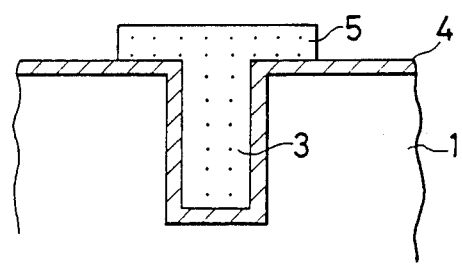
Figure 2A:
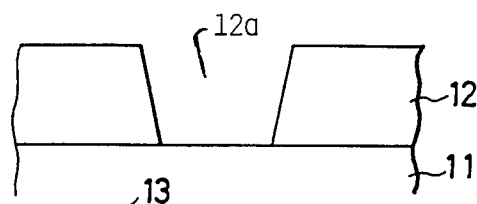
FIGS. 2A to 2I are schematic cross-sectional views showing various steps of fabrication of a semiconductor device according to the present invention.

First, as shown in FIG. 2A, thermal-oxide mask 12 for forming a trench by etching is formed on a semiconductor substrate 11. The thickness of the oxide mask 12 may for example be about 7000 Å. The oxide mask 12 has an opening 12a that is at a position where the trench will be formed and has a slightly larger dimension than the trench to be formed.

Figure 2B:
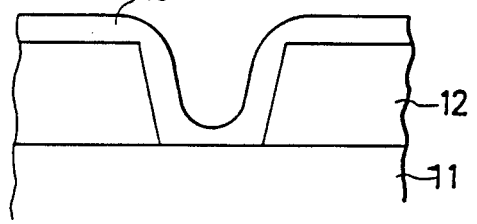
Figure 2C:
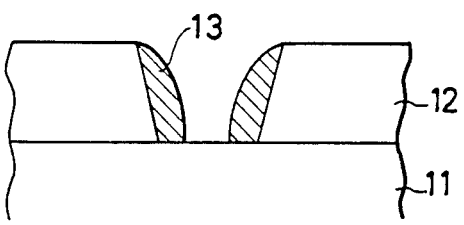
Figure 2D:
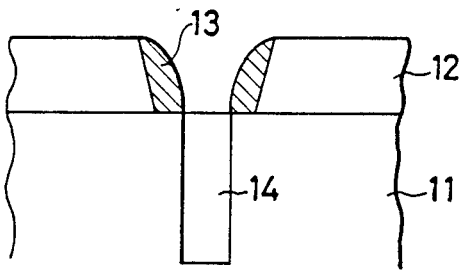
Figure 2E:
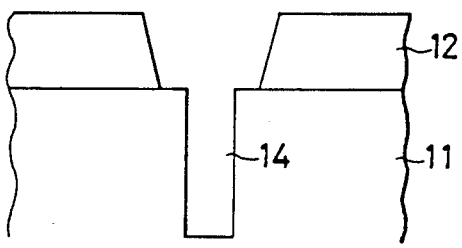
Figure 2F:
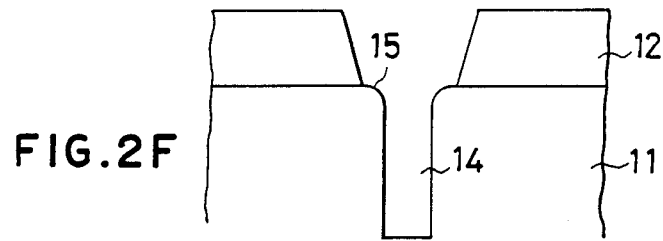

Next, as shown in FIG. 2B, a phospho-silicate glass (PSG) layer 13 is unselectively formed over the oxide mask 12 and the substrate 11. The PSG layer 13 may be 3000 Å thick. Then, anisotropic etching, e. g., reactive ion etching is performed to remove most of the PSG layer 13 except at the sides of the opening 12a, leaving sidewalls 13, as shown in FIG. 2C. The resultant thickness of the sidewall can be controlled by the initial thickness of the deposited PSG layer 13. If the initial thickness of the deposited PSG layer 13 is 3000 Å, the thickness of the sidewall 13 will be about 2500 Å.

Next, anisotropic etching, e. g., reactive ion etching is again performed using the oxide mask 12 and the sidewalls 13 as a mask to form a trench 14 in the silicon substrate 11. The trench 14 may be made to be 4 μm deep.

Then, the sidewalls 13 are selectively removed. For instance when hydrofluoric acid buffer solution is used as the etchant, the PSG film has an etching rate ten times greater than the thermal oxide film. The silicon substrate 11 is hardly etched. Accordingly, the sidewalls 13 can be selectively removed.

The sharp edges of the trench are thereafter rounded. This can be achieved by etching which may be wet etching or dry etching, or by oxidation. Here dry etching is described as an example.

The dry etching can be performed under the same condition as the etching for forming the trench, to etch 100 to 1000 Å (at the surface of the silicon substrate). The edges have a higher etching rate, so that they are rounded as indicated by reference numeral 15 in FIG. 2F.

Similar results are obtained if oxidation is employed.

Figure 2G:
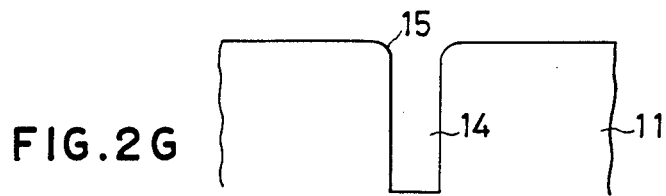
Figure 2H:
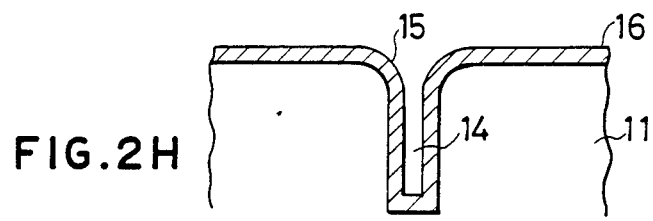
Figure 2I:
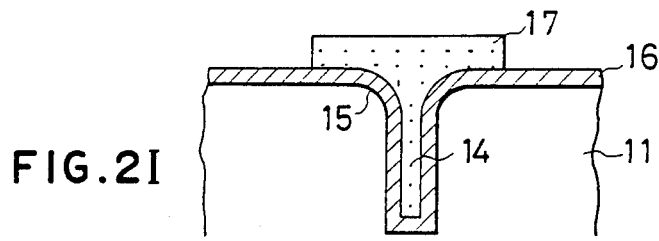

After the edges are rounded, the oxide mask 12 is removed as shown in FIG. 2G. Then an insulator film 16 is formed as shown in FIG. 2H and an electrode 17 is then formed as shown in FIG. 2I. These steps are identical to those in the prior art process.

The semiconductor device fabricated by the above process will not have sharp edges, so that leakage currents are reduced. It therefore has excellent device characteristics.

In the embodiment described, a thermal-oxide film and a PSG film are used to form in combination a mask for forming a trench. The mask can comprise other combination provided that one of the constituents (mask layers) of the mask can be selectively removed while the other constituent (mask layer) remain unaffected. For instance, the combination of an $Si_3N_4$ film formed by plasma CVD and an $SiO_2$ film formed by CVD can be used, with the former being in place of the thermal-oxide film of the above embodiment and the latter being in place of the PSG layer of the above embodiment.

What is claimed is:

1. A process for fabricating a semiconductor device which includes a semiconductor substrate having a trench formed at a predetermined area in a surface thereof, said trench having a rounded corner at the surface of said substrate, wherein said process comprises the steps of:
   (a) forming a first mask layer on said surface of said substrate, said first mask layer having an opening therein with a side spaced from said predetermined area;
   (b) forming a second mask layer on said side of the opening of said first mask layer, said second mask layer having an opening therein with a side wall substantially aligned with said predetermined area where said trench is to be formed;
   (c) forming a trench in said substrate at said predetermined area using said first and second mask layers as a mask;
   (d) removing said second mask layer; and
   (e) dry etching said substrate at said predetermined area using said first mask layer as a mask, whereby the edge of said trench, which has a higher etching rate than the remainder of said substrate under dry etching, is rounded.

2. A process according to claim 1, wherein said dry etching step (e) is performed by reactive ion etching.

3. A process according to claim 1, wherein step (b) of forming said second mask layer comprises the steps of:
   (b1) unselectively forming a layer of the material of said second mask layer on said first mask layer and on the semiconductor substrate; and
   (b2) etching said layer of material to remove said unselectively-formed layer except on the side of the opening of said first mask layer, whereby said side wall of said second mask layer remains on the side of the opening in said first mask layer.

4. A process according to claim 3, wherein said anisotropic etching at step (b2) is performed by reactive ion etching.

5. A process according to claim 1, wherein said second layer is selectively removable with respect to said first mask layer, said second layer having an etching rate which is substantially higher than that of said first mask layer.

6. A process according to claim 1, wherein said first mask layer comprises an oxide film.

7. A process according to claim 1, wherein said trench formed by step (c) is about 4 $\mu$m deep.

8. A process according to claim 1, wherein said dry etching at step (e) is performed until the substrate is etching from about 100 to 1000 Å.

9. A process according to claim 1, further comprising the steps of:
   (f) removing said first mask layer;
   (g) forming an insulator film on the surface of said trench and said substrate; and
   (h) forming an electrode layer within said trench.

* * * * *